(12) United States Patent
Lo et al.

(10) Patent No.: US 7,886,609 B2
(45) Date of Patent: Feb. 15, 2011

(54) PRESSURE SENSOR PACKAGE

(75) Inventors: Wai Yew Lo, Petaling Jaya (MY); Boon Seong Lee, Malacca (MY); Kar Yoke Ong, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 133 days.

(21) Appl. No.: 12/436,154

(22) Filed: May 6, 2009

(65) Prior Publication Data
US 2010/0281993 A1 Nov. 11, 2010

(51) Int. Cl.
*G01L 9/12* (2006.01)
(52) U.S. Cl. ......................................................... 73/724
(58) Field of Classification Search .................... 73/708, 73/706, 718–721, 715, 724–727
See application file for complete search history.

(56) References Cited

U.S. PATENT DOCUMENTS

| | | | |
|---|---|---|---|
| 5,692,637 A | 12/1997 | Hodge | |
| 5,719,069 A * | 2/1998 | Sparks | 438/50 |
| 5,811,684 A | 9/1998 | Sokn | |
| 5,874,679 A | 2/1999 | Sokn | |
| 5,996,419 A | 12/1999 | Sokn | |
| 6,401,545 B1 * | 6/2002 | Monk et al. | 73/756 |
| 7,632,698 B2 * | 12/2009 | Hooper et al. | 438/51 |
| 2008/0116560 A1 | 5/2008 | Mangrum et al. | |
| 2008/0136012 A1 | 6/2008 | Yang et al. | |

* cited by examiner

*Primary Examiner*—Jewel Thompson
(74) *Attorney, Agent, or Firm*—Charles Bergere

(57) ABSTRACT

A semiconductor package (10) including a pressure sensor die (14) has an interconnect layer (22) formed over a first major surface of the pressure sensor die (14). An encapsulant (18) encapsulates a second major surface and sides of the pressure sensor die (14). A cavity (32) extends through the interconnect layer (22) to the first major surface of the pressure sensor die (14). The interconnect layer (22) allows for the assembly of a low-profile package.

20 Claims, 5 Drawing Sheets

PRESSURE SENSOR PACKAGE

BACKGROUND OF THE INVENTION

The present invention relates to the packaging of semiconductor devices and more particularly to a pressure sensor package.

Conventional pressure sensor packages include a pressure sensor base, a pressure sensor diaphragm positioned over the base, and a cap positioned over the diaphragm. The cap is secured to the pressure sensor base in such a way that a portion of the diaphragm is deformed between the pressure sensor cap and the pressure sensor base. Such conventional pressure sensor packages are expensive to manufacture, with the pressure sensor cap and substrate making up about 80 to 90 percent (%) of the overall package cost.

Accordingly, it would be desirable to have a pressure sensor package that is less costly to manufacture.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
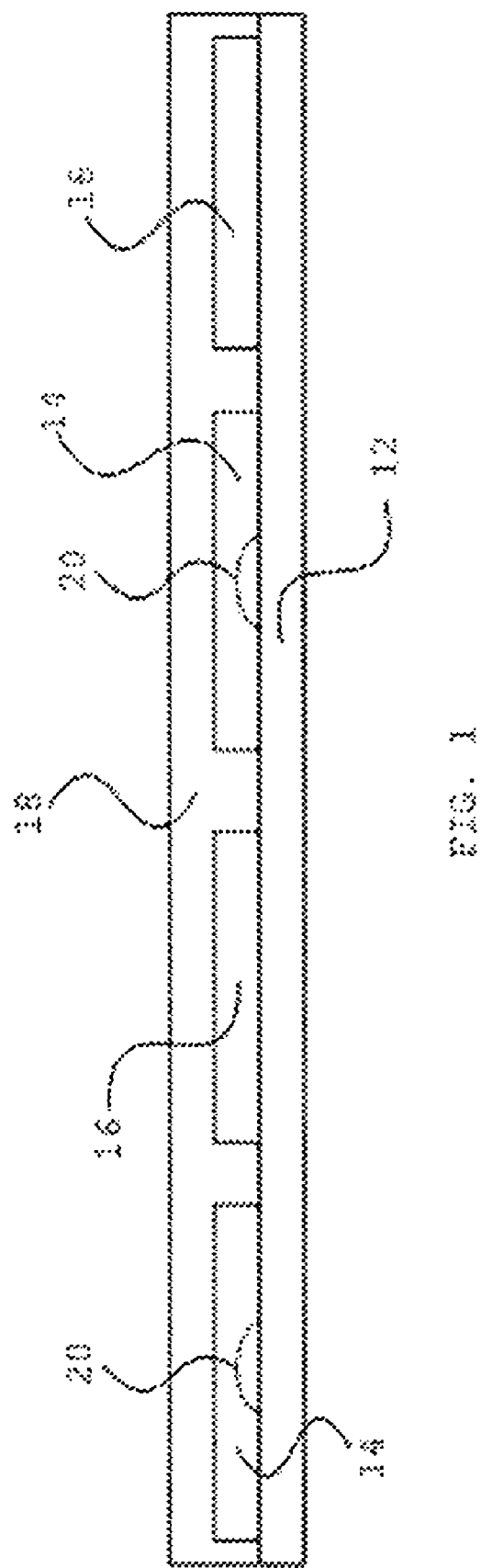
FIG. 1 is an enlarged cross-sectional view of a plurality of semiconductor devices attached to a tape and encapsulated with an encapsulant in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a semiconductor package including a pressure sensor die. An interconnect layer is formed over a first major surface of the pressure sensor die. An encapsulant encapsulates a second major surface and sides of the pressure sensor die. A cavity extends through the interconnect layer to the first major surface of the pressure sensor die. In one embodiment, a gel coat material is deposited in the cavity.

The present invention further provides a pressure sensor package including a pressure sensor die and a second semiconductor device electrically connected to the pressure sensor die. An interconnect layer is formed over first major surfaces of the pressure sensor die and the second semiconductor device. An encapsulant encapsulates second major surfaces and sides of the pressure sensor die and the second semiconductor device. A cavity extends through the interconnect layer to the first major surface of the pressure sensor die.

The present invention also provides a method of forming a pressure sensor package including the step of attaching a first major surface of a pressure sensor die to a tape. A second major surface and sides of the pressure sensor die are encapsulated with an encapsulant. The tape is removed from the first major surface of the pressure sensor die and an interconnect layer is formed over the first major surface of the pressure sensor die. A cavity is formed in the interconnect layer, the cavity extending through the interconnect layer to the first major surface of the pressure sensor die. In one embodiment, a gel coat material may be deposited in the cavity.

FIGS. 1 through 4 are enlarged cross-sectional views that illustrate a method of forming a plurality of pressure sensor packages 10 in accordance with an embodiment of the present invention.

Referring now to FIG. 1, a tape 12 is provided and first major surfaces of a plurality of first semiconductor devices 14 and a plurality of second semiconductor devices 16 are attached to the tape 12. Second major surfaces and sides of the first and second semiconductor devices 14 and 16 are encapsulated with an encapsulant 18. Each of the first semiconductor devices 14 is a pressure sensor die 14 having a diaphragm 20. In the embodiment shown, the first major surfaces of the first and second semiconductor devices 14 and 16 correspond to the surfaces having active circuitry and further in the case of the pressure sensor dice 14, the sides on which the diaphragms 20 are located.

The tape 12 may be a polyimide (PI) tape, an ultraviolet (UV) tape, a thermal release tape or other well known and commercially available adhesive tapes. It is preferred that the tape 12 has a thickness of between about 0.05 millimeters (mm) and about 0.5 mm. However, it will be understood by those of skill in the art that the invention is not limited by the thickness of the tape 12.

The pressure sensor dice 14 may be piezoresistive transducer dice, capacitive transducer dice, the like, or combinations thereof. Such dice are well known to those of ordinary skill in the art. Accordingly, detailed description of the pressure sensor dice 14 is not required for a complete understanding of the present invention.

The second semiconductor devices 16 may be any type of integrated circuit (IC) dice such as, for example, application specific integrated circuits (ASICs), microcontrollers (MCUs), the like, or combinations thereof. Such devices are well known to those of ordinary skill in the art. Therefore, further description of these devices is not required for a complete understanding of the present invention.

A molding operation such as, for example, injection molding is performed to encapsulate the first and second semiconductor devices 14 and 16. The encapsulant 18 may comprise well known commercially available encapsulant material such as, for example, an epoxy molding compound.

Figure 2:
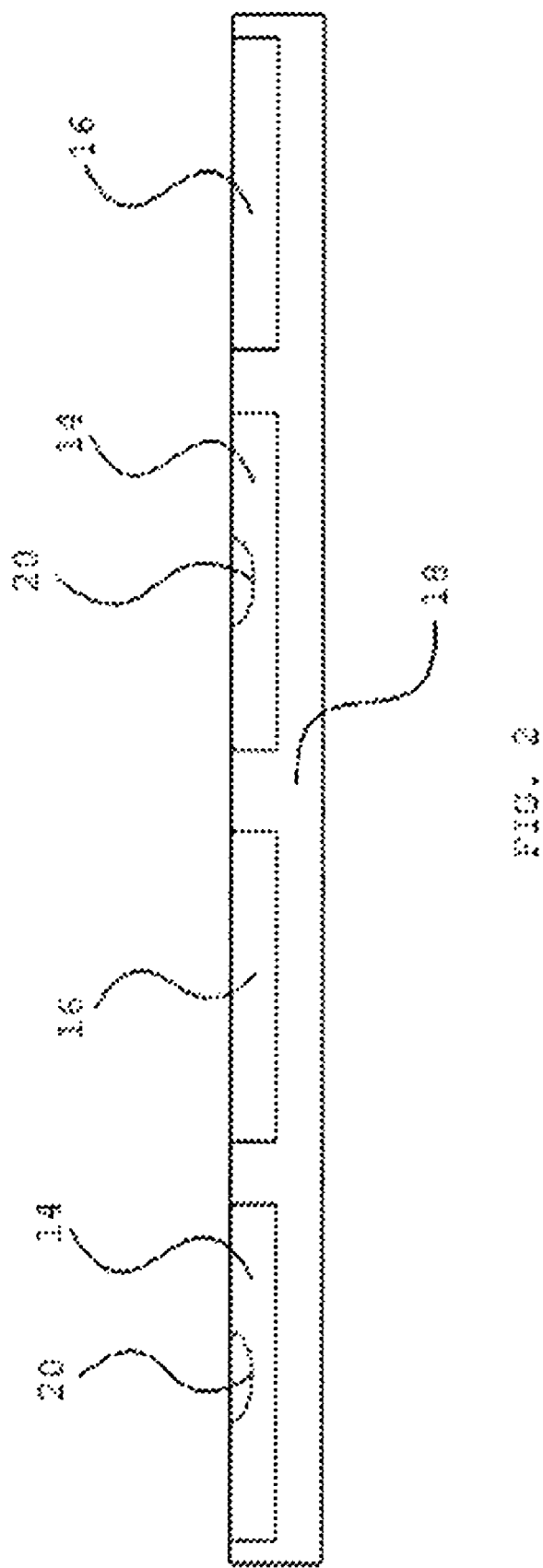
FIG. 2 is an enlarged cross-sectional view of the semiconductor devices of FIG. 1 after tape removal.

Referring now to FIG. 2, the tape 12 is removed to expose the first major surfaces of the first and second semiconductor devices 14 and 16 and the first and second semiconductor devices 14 and 16 are positioned in a "dead bug" or bottom-side up orientation, which facilitates further processing and protects a diaphragm of the pressure sensor from being damaged during such further processing.

The tape 12 may be removed by peeling off, applying heat, ultraviolet irradiation or a solvent, etc., depending on the type of adhesive tape used.

Figure 3:
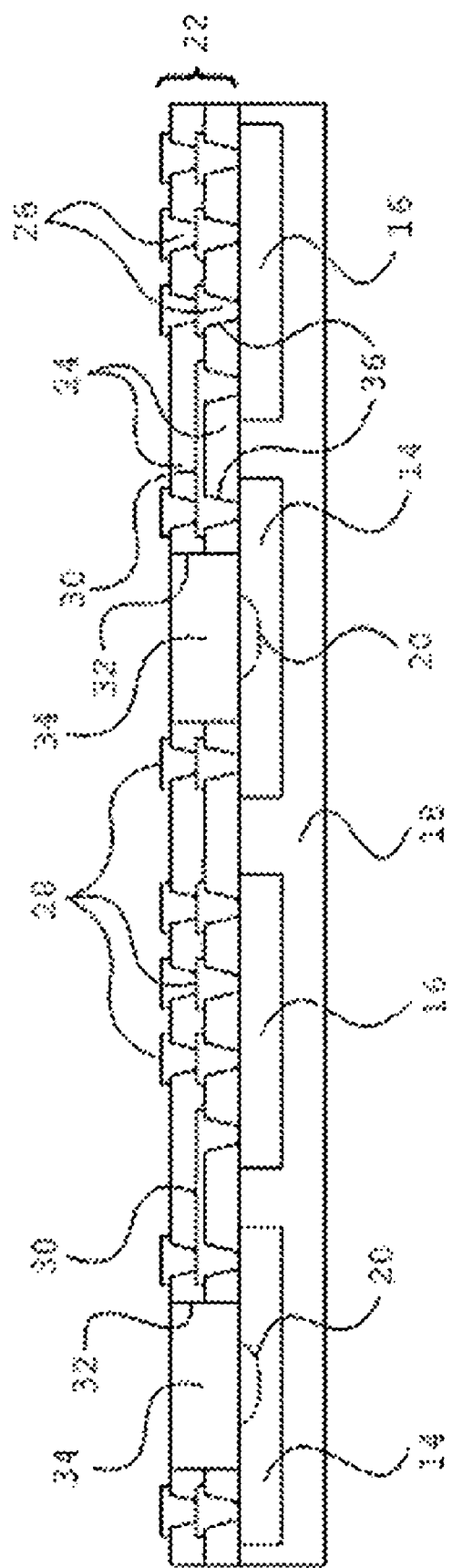
FIG. 3 is an enlarged cross-sectional view of an interconnect layer formed on first major surfaces of the semiconductor devices of FIG. 2.

Referring now to FIG. 3, an interconnect layer 22 is formed on the first major surfaces of the first and second semiconductor devices 14 and 16. The interconnect layer 22 includes an insulative material 24. A plurality of vias 26 is formed in the insulative material 24 and a plurality of conductive pads 28 are formed on respective ones of the vias 26. A plurality of conductive traces 30 electrically connecting the conductive pads 28. A plurality of cavities 32 is formed in the interconnect layer 22, each of the cavities 32 extending through the interconnect layer 22 to the first major surface of respective ones of the pressure sensor dice 14. Preferably, a gel coat material 34 is deposited in each of the cavities 32.

The interconnect layer 22 may be formed, in one embodiment, via a photolithography process. In such an embodiment, the insulative material 24 may comprise a known positive or negative photo-resist. Preferably a soft photo-resist material is used, which serves to protect the diaphragms 20 from damage during the interconnect layer 22 build up process. The photolithography process includes depositing the insulative material 24 on the first major surfaces of the first and second semiconductor devices 14 and 16. The insulative material 24 is patterned, developed and etched to form a plurality of via holes 36. A conductive material such as, for example, copper is deposited in the via holes 36 and over the insulative material 24. The conductive pads 28 and the conductive traces 30 are formed by patterning the conductive material. The described build up process steps may be repeated to form additional layers of the interconnect layer 22. The conductive traces 30 may be routed or redistributed among the one or more layers. The cavities 32 are formed thereafter by patterning, developing and etching the insulative material 24. The interconnect layer 22 described above allows for redistribution of package interconnections. Applying such redistributive chip packaging techniques to a pressure sensor device allows for the assembly of a low profile pressure sensor package.

The gel coat material 34 may comprise a low modulus and low viscosity material such as, for example, a low viscosity silicone potting gel. The soft gel coat material 34 protects the diaphragms 20 of the pressure sensor dice 14 from being damaged during and subsequent to the assembly process. The gel coat material 34 may be deposited via printing or spin coating and then cured.

Figure 4:
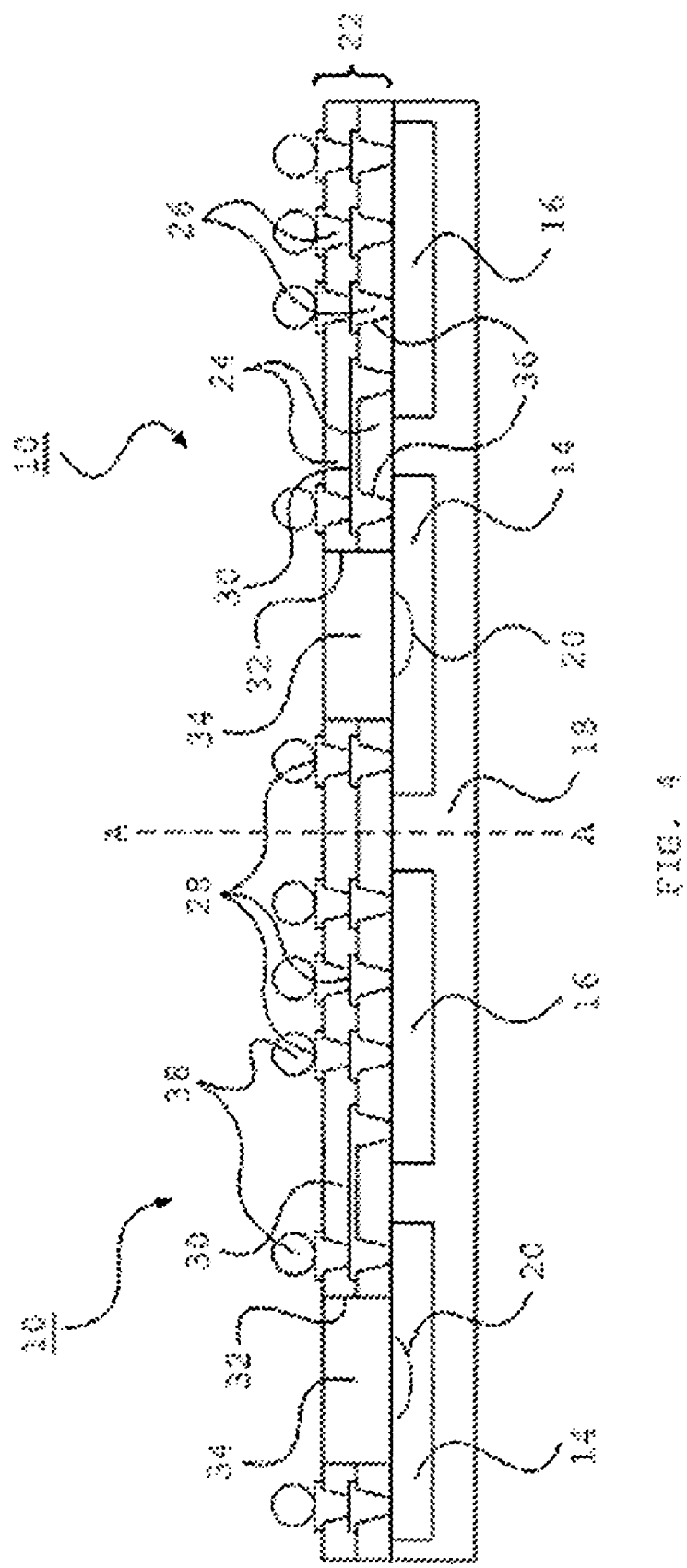
FIG. 4 is an enlarged cross-sectional view of a plurality of pressure sensor packages in accordance with an embodiment of the present invention.

Referring now to FIG. 4, a plurality of conductive balls 38 is attached to exposed portions of respective ones of the exposed conductive pads 28. The conductive balls 38 may be controlled collapse chip carrier connection (C5) solder balls and may be attached to the conductive pads 28 using known solder ball attach processes.

Adjacent ones of the pressure sensor packages 10 are separated along the vertical line A-A by performing a singulating operation. The pressure sensor packages 10 may be separated by saw singulation, for example. The singulating operation may be performed prior to or after attaching the conductive balls 38 to the conductive pads 28. The pressure sensor packages 10 may have a package profile of between about 0.1 mm and about 2.0 mm.

Figure 5:
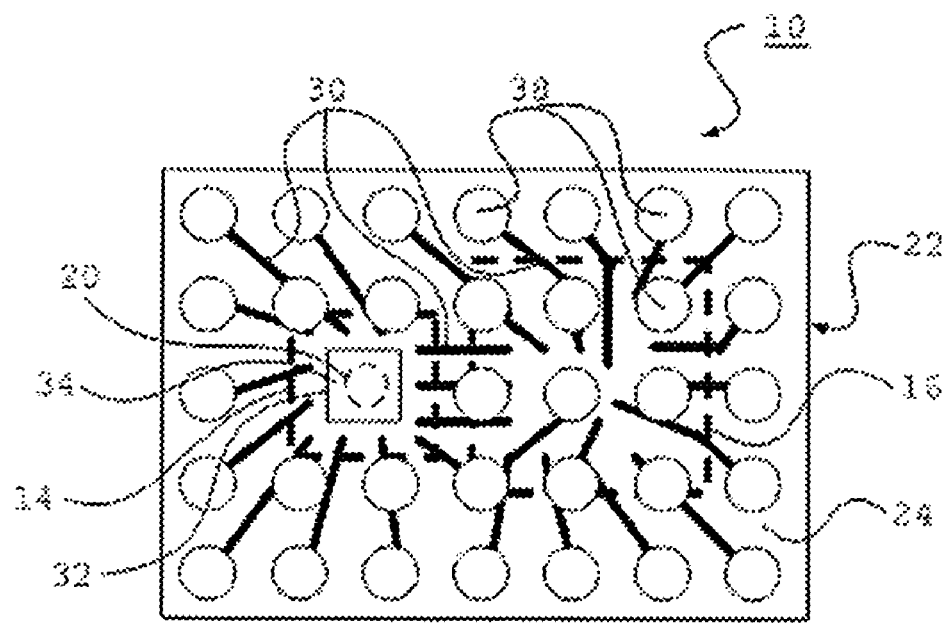
FIG. 5 is an enlarged schematic top plan view of one of the pressure sensor packages of FIG. 4.

Referring now to FIG. 5, an enlarged schematic top plan view of one of the pressure sensor packages 10 of FIG. 4 is shown. As shown in FIG. 5, the conductive traces 30 electrically connect the pressure sensor die 14 and the second semiconductor device 16 to one another and to the conductive balls 38. In the embodiment shown, the conductive balls 38 are laid out in an array format, forming a ball grid array (BGA) package.

Figure 6:
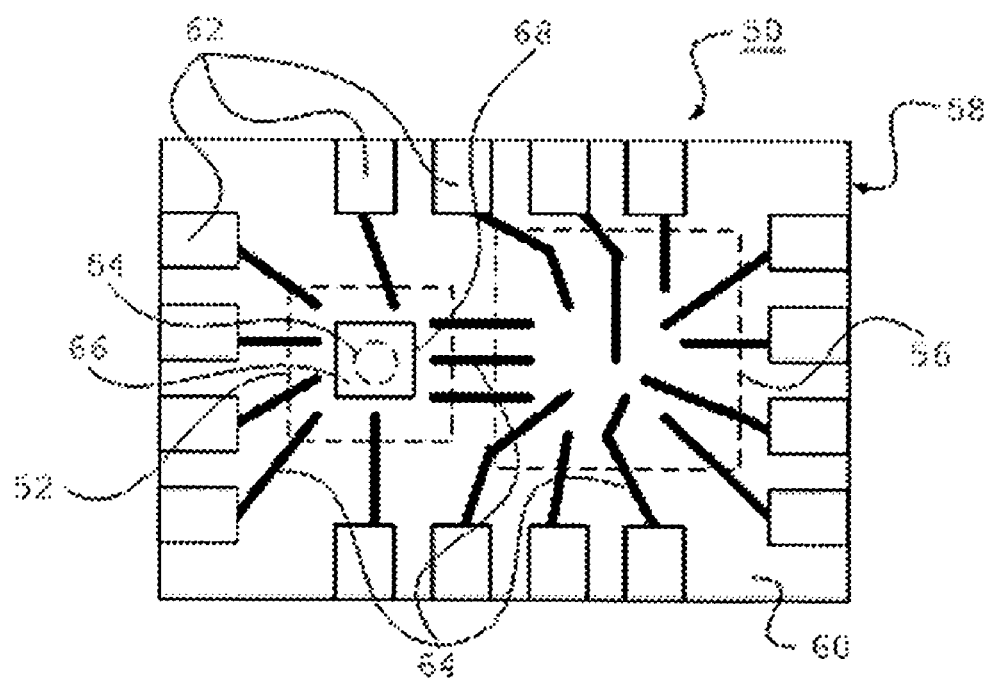
FIG. 6 is an enlarged schematic top plan view of a pressure sensor package in accordance with another embodiment of the present invention.

Referring now to FIG. 6, an enlarged schematic top plan view of a pressure sensor package 50 in accordance with another embodiment of the present invention is shown. The pressure sensor package 50 includes a pressure sensor die 52 having a diaphragm 54 and a second semiconductor device 56. An interconnect layer 58 is formed over first major surfaces (i.e. the active surfaces) of the pressure sensor die 52 and the second semiconductor device 56. Second major surfaces and sides of the pressure sensor die 52 and the second semiconductor device 56 are encapsulated with an encapsulant (not shown). The interconnect layer 58 includes an insulative material 60, a plurality of vias (not shown) in the insulative material 60, a plurality of conductive pads 62 formed on respective ones of the vias, and a plurality of conductive traces 64. The conductive traces 64 electrically connect the pressure sensor die 52 and the second semiconductor device 56 to one another and to the conductive pads 62. A gel coat material 66 is deposited in a cavity 68 formed in the interconnect layer 58, the cavity 68 extending through the interconnect layer 58 to the first major surface of the pressure sensor die 52.

In the embodiment shown in FIG. 6, the pressure sensor package 50 is a land grid array (LGA) package and is largely similar to the pressure sensor package 10 of FIG. 5, differing mainly in that there are no conductive balls attached to the exposed conductive pads 62. Accordingly, detailed description of the components of the pressure sensor package 50 of FIG. 6 is not required for a complete understanding of the present invention. The pressure sensor package 50 may have a package profile of between about 0.1 mm and about 2 mm.

When board mounted, the standoff between the board and the gel coat material 34 and 66 provided by the conductive balls 38 or other solder material applied to the conductive pads 62 of the LGA pressure sensor package 50 for board mounting offers further protection against diaphragm damage.

Although the pressure sensor packages 10 and 50 are illustrated as including a second semiconductor device 16 and 56, it should be understood that the present invention is not limited to semiconductor packages having two (2) semiconductor devices. Semiconductor packages of the present invention may have only one or greater than two semiconductor devices in alternative embodiments.

As is evident from the foregoing discussion, the present invention provides a pressure sensor package that is less costly to manufacture since it does not involve the use of an expensive pressure sensor cap or substrate. Further advantageously, the pressure sensor package of the present invention can be thinly formed since it is not constrained by the thickness of a conventional substrate. The redistributed chip build up technology employed allows formation of a redistributed pressure sensor package with high input/output (IO) density and multi package functionality.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A semiconductor package, comprising:
    a pressure sensor die;
    an interconnect layer formed over a first major surface of the pressure sensor die;
    an encapsulant encapsulating a second major surface and sides of the pressure sensor die; and
    a cavity extending through the interconnect layer to the first major surface of the pressure sensor die.

2. The semiconductor package of claim 1, further comprising a gel coat material deposited in the cavity.

3. The semiconductor package of claim 2, wherein the gel coat material comprises a silicone potting gel.

4. The semiconductor package of claim 1, wherein the interconnect layer comprises:
    an insulative material;
    a plurality of vias formed in the insulative material;
    a plurality of conductive pads formed on respective ones of the vias, wherein a surface of the conductive pads is exposed; and
    a plurality of conductive traces electrically connecting the conductive pads with various ones of the vias.

5. The semiconductor package of claim 4, wherein the insulative material comprises a photo-resist material.

6. The semiconductor package of claim 4, further comprising a plurality of conductive balls attached to respective ones of the exposed conductive pads.

7. The semiconductor package of claim 1, wherein the pressure sensor die is one of a piezo-resistive transducer and a capacitive transducer.

8. The semiconductor package of claim 1, wherein the semiconductor package has a package profile of between about 0.1 millimeters (mm) and about 2 mm.

9. The semiconductor package of claim 1, further comprising a second semiconductor device electrically connected to the pressure sensor die, wherein the interconnect layer is formed over a first major surface of the second semiconductor device and the encapsulant encapsulates a second major surface and sides of the second semiconductor device.

10. A pressure sensor package, comprising:
    a pressure sensor die;
    an interconnect layer formed over a first major surface of the pressure sensor die;
    an encapsulant encapsulating a second major surface and sides of the pressure sensor die;
    a cavity extending through the interconnect layer to the first major surface of the pressure sensor die; and
    a gel coat material deposited in the cavity.

11. The pressure sensor package of claim 10, wherein the interconnect layer comprises:
    an insulative material;
    a plurality of vias formed in the insulative material;
    a plurality of conductive pads formed on respective ones of the vias, wherein a surface of the conductive pads is exposed; and
    a plurality of conductive traces electrically connecting various ones of the conductive pads with various ones of the vias.

12. The pressure sensor package of claim 11, wherein the insulative material comprises a photo-resist material.

13. The pressure sensor package of claim 11, further comprising a plurality of conductive balls attached to respective ones of the exposed conductive pads.

14. The pressure sensor package of claim 10, wherein the pressure sensor die is one of a piezo-resistive transducer and a capacitive transducer.

15. The pressure sensor package of claim 10, wherein the pressure sensor package has a package profile of between about 0.1 mm and about 2 mm.

16. The pressure sensor package of claim 10, further comprising a second semiconductor device electrically connected to the pressure sensor die, wherein the interconnect layer is formed over a first major surface of the second semiconductor device and the encapsulant encapsulates a second major surface and sides of the second semiconductor device.

17. A pressure sensor package, comprising:
    a pressure sensor die;
    a second semiconductor device electrically connected to the pressure sensor die;
    an interconnect layer formed over first major surfaces of the pressure sensor die and the second semiconductor device;
    an encapsulant encapsulating second major surfaces and sides of the pressure sensor die and the second semiconductor device; and
    a cavity extending through the interconnect layer to the first major surface of the pressure sensor die.

18. The pressure sensor package of claim 17, further comprising a gel coat material deposited in the cavity.

19. The pressure sensor package of claim 17, wherein the interconnect layer comprises:
    an insulative material having a plurality of vias formed therein;
    a plurality of conductive pads formed on respective ones of the vias, wherein a surface of the conductive pads is exposed; and
    a plurality of conductive traces electrically connecting the conductive pads.

20. The pressure sensor package of claim 19, wherein the insulative material comprises a photo-resist material.

* * * * *